United States Patent [19]
Dible et al.

[11] Patent Number: 5,824,606
[45] Date of Patent: Oct. 20, 1998

[54] METHODS AND APPARATUSES FOR CONTROLLING PHASE DIFFERENCE IN PLASMA PROCESSING SYSTEMS

[75] Inventors: Robert D. Dible; Stephen G. Bradley; Seyed Jafar Jafarian-Tehrani, all of Fremont, Calif.

[73] Assignee: Lam Research Corporation, Fremont, Calif.

[21] Appl. No.: 642,172

[22] Filed: Mar. 29, 1996

[51] Int. Cl.$^6$ ................................ H01L 21/00; B44C 1/22
[52] U.S. Cl. ........................ 438/729; 156/345; 216/60; 216/67; 438/9; 438/14
[58] Field of Search .................. 216/67, 59, 60; 156/345 P, 345 C, 345 MT; 118/723 E, 723 ER, 723 I, 723 IR; 204/298.08, 298.34; 438/9, 14, 729

[56] References Cited

U.S. PATENT DOCUMENTS

| | | | |
|---|---|---|---|
| 4,539,068 | 9/1985 | Takagi et al. ........................... | 156/614 |
| 5,057,185 | 10/1991 | Thomas, III et al. .................. | 156/643 |
| 5,116,482 | 5/1992 | Setoyama et al. ................ | 204/298.08 |
| 5,147,493 | 9/1992 | Nishimura et al. ...................... | 156/345 |
| 5,228,939 | 7/1993 | Chu ........................................ | 156/345 |
| 5,273,616 | 12/1993 | Bozler et al. ............................ | 156/603 |
| 5,332,880 | 7/1994 | Kubota et al. ...................... | 219/121.52 |
| 5,401,350 | 3/1995 | Patrick et al. ........................... | 156/345 |
| 5,414,324 | 5/1995 | Roth et al. ........................... | 315/111.21 |
| 5,433,813 | 7/1995 | Kuwabara ............................... | 156/345 |
| 5,436,424 | 7/1995 | Nakayama et al. ................ | 219/121.43 |
| 5,573,595 | 11/1996 | Dible ...................................... | 118/723 |
| 5,643,364 | 7/1997 | Zhao et al. ........................... | 118/723 I |
| 5,698,062 | 12/1997 | Sakamoto et al. ...................... | 156/345 |

FOREIGN PATENT DOCUMENTS

| | | |
|---|---|---|
| WO 95/15672 | 6/1995 | European Pat. Off. . |
| WO 95/32315 | 11/1995 | European Pat. Off. . |
| 0685873A1 | 12/1995 | European Pat. Off. . |

*Primary Examiner*—William Powell
*Attorney, Agent, or Firm*—Beyer & Weaver, LLP

[57] ABSTRACT

A method in a plasma processing system for modifying a phase difference between a first radio frequency (RF) signal and a second RF signal. The first RF signal is supplied by a first RF power source to a first electrode and the second RF signal is supplied by a second RF power source to a second electrode of a plasma processing system. The second RF power source is coupled to the first RF power source as a slave RF power source in a master-and-slave configuration. The method includes the step of ascertaining a phase difference between a phase of the first RF signal and a phase of the second RF signal. The method further includes the step of comparing the phase difference with a phase control set point signal to output a control signal to the second RF power source, whereby the second RF power source, responsive to the control signal, modifies the phase of the second RF signal to cause the phase difference to approximate a phase difference value represented by the phase control set point signal.

16 Claims, 11 Drawing Sheets

METHODS AND APPARATUSES FOR CONTROLLING PHASE DIFFERENCE IN PLASMA PROCESSING SYSTEMS

BACKGROUND OF THE INVENTION

The present invention relates to methods and apparatuses for inducing plasma in plasma enhanced processing systems, which are typically used in semiconductor fabrication. More specifically, the invention relates to methods and apparatuses for controlling the phase shift between generators in plasma processing systems to achieve desired process results.

Plasma-enhanced semiconductor processes for etching, oxidation, anodization, chemical vapor deposition (CVD), or the like are known. For illustration purposes, FIG. 1 shows a chemical etch reactor 100, representing a plasma generating system which utilizes an inductive coil for plasma generation. Reactor 100 includes coil system 102 and chamber 124. Coil system 102 includes a coil element 106, which is excited by a radio frequency generator 110. Coil element 106 is coupled to a matching circuit 108 for matching the impedance of coil element 106 to that of radio frequency generator 110. The matching of the impedances permits radio frequency generator 110 to efficiently deliver power to coil element 106. To provide a path to ground, the chamber wall of chamber 124 is typically grounded. Alternatively, the ground path may be provided through the lower electrode, e.g., a chuck 128 of FIG. 1, when the plasma is confined.

Within chamber 124, there typically exists a shower head 126. Shower head 126 is shown disposed above a chuck 128 and wafer 134, which is supported by chuck 128. Chuck 128 acts as a second electrode and is preferably biased by its independent radio frequency circuit 120 via a matching network 122. It should be borne in mind that the components of FIG. 1, as well as of other figures herein, are shown only representatively for ease of illustration and to facilitate discussion. In actuality, coil element 106 and match 108 are typically disposed proximate to chamber 124 while RF generator 110 may be placed in any reasonable location.

Shower head 126 represents the apparatus for dispensing etchant or deposition materials onto wafer 134. Shower head 126 preferably includes a plurality of holes for releasing gaseous source materials (typically around the periphery edge of shower head 126) into the RF-induced plasma region between itself and wafer 134 during operation. In one embodiment, shower head 126 is made of quartz although it may also be made of other suitable materials and may be left either electrically floating or grounded.

To provide power to the plasma etch system 100, generators 110 and 120 are typically driven at a given RF frequency. To ensure that both generators deliver power at the same frequency, they may be frequency-locked in a master-and-slave configuration. For example, lower (bias) generator 120 may be designated the master, and the frequency of the upper (coil) generator 110 may slaved to that of master generator 120 (or vice versa). Frequency locking may be achieved by any conventional technique, including, e.g., disabling the frequency-generating crystal in the slave generator and employing the frequency-generating crystal in the master generator to drive both the master and slave generators.

While the configuration of the two generators in a master-and-slave configuration enables both generators to deliver power at the same RF frequency, such a configuration does not guarantee that power will be delivered by the two generators at the same phase. A phase difference may arise due to factors internal to the generators themselves or due to system parameters such as the difference in the lengths of the cables that couple the generators to their respective electrodes. It is discovered that the phase difference may give rise to undesirable or unexpected process and electrical characteristics, which may lead to uncertain consequences on the process results.

In view of the foregoing, what is desired is methods and apparatuses for controlling the phase difference between master-and-slave configured RF generators that are employed to deliver power to plasma processing systems.

SUMMARY OF THE INVENTION

The invention relates, in one embodiment, to a plasma processing system for generating plasma for use in semiconductor fabrication. The plasma processing chamber has a first radio frequency (RF) power source for outputting a first RF signal to a first electrode and a second RF power source for outputting a second RF signal to a second electrode. The second RF power source is coupled to the first RF power source as a slave RF power source in a master-and-slave configuration. The plasma processing system includes a control circuit, which includes a first sensor circuit coupled to the first electrode for detecting a phase of the first RF signal and a second sensor circuit coupled to the second electrode for detecting a phase of the second RF signal.

The plasma processing system further includes a mixer circuit coupled to the first sensor circuit and the second sensor circuit for detecting a phase difference between the first RF signal and the second RF signal and for outputting a first signal representing the phase difference. There is further included a phase servo circuit coupled to the second RF power source and the mixer circuit. The phase servo circuit outputs, responsive to the first signal and a phase control set point signal, a control signal to the second RF power source for modifying a phase of the second RF signal, thereby causing the phase difference to approximate a phase difference value represented by the phase control set point signal.

In another embodiment, the invention relates to a method in a plasma processing system for modifying a phase difference between a first radio frequency (RF) signal and a second RF signal. The first RF signal is supplied by a first RF power source to a first electrode and the second RF signal is supplied by a second RF power source to a second electrode of a plasma processing system. The second RF power source is coupled to the first RF power source as a slave RF power source in a master-and-slave configuration. The method includes the step of ascertaining a phase difference between a phase of the first RF signal and a phase of the second RF signal. The method further includes the step of comparing the phase difference with a phase control set point signal to output a control signal to the second RF power source, whereby the second RF power source, responsive to the control signal, modifies the phase of the second RF signal to cause the phase difference to approximate a phase difference value represented by the phase control set point signal.

These and other advantages of the present invention will become apparent upon reading the following detailed descriptions and studying the various figures of the drawings.

DETAILED DESCRIPTION OF THE PREFERRED EMBODIMENTS

An invention is described for improving process results by controlling the phase difference of the phases of the RF signals supplied by the RF power supplies of a plasma processing system. In the following description, numerous specific details are set forth in order to provide a thorough understanding of the present invention. It will be obvious, however, to one skilled in the art, that the present invention may be practiced without some or- all of these specific details. In other instances, well known process steps have not been described in detail in order not to unnecessarily obscure the present invention.

Figure 2A:
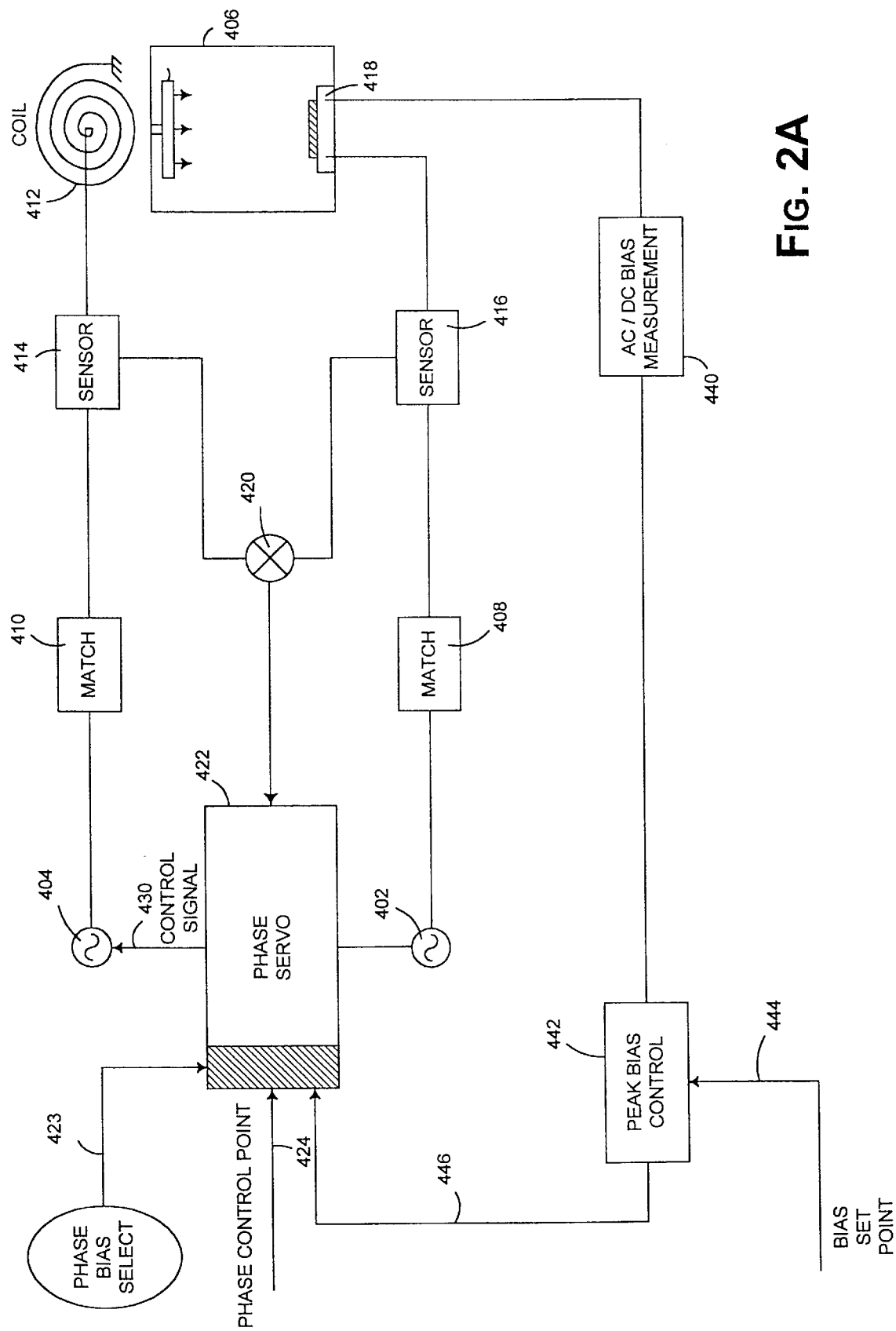
FIG. 2A is a schematic illustrating, in one embodiment of the present invention, the overall control circuit for controlling the phase difference between two frequency-locked RF generators of a plasma processing system.

FIG. 2A is a schematic illustrating, in one embodiment of the present invention, the overall control circuit for controlling the phase difference between two frequency-locked RF generators of a plasma processing system. In FIG. 2A, RF generators 402 and 404 are arranged in a master-and-slave configuration with RF generator 402 acting as the reference generator. Power to the plasma in a plasma processing chamber 406 are delivered by these two RF generators 402 and 404 through match circuits 408 and 410, respectively. It should be noted that although the chuck RF generator, e.g., RF generator 402, is designated the master generator in FIG. 2A, the invention applies equally well when the RF generator associated with the upper electrode, e.g., RF generator 404, is designated the master. Further, although the upper electrode 412 is shown having an Archimedes spiral coil in FIG. 2A, other suitable electrodes may well be employed to generate plasma within the plasma processing chamber. One end of the coil may be isolated from ground, e.g., through a transformer, or grounded.

To ascertain the phase of the RF signal supplied to coil 412, a sensor 414 is coupled to one end of coil 412. Sensor 414 is preferably disposed between coil 412 and match network 410 to avoid the effects of the tuning networks that are used for impedance matching. Likewise, a sensor 416 is preferably coupled between chuck electrode 418 and match circuit 408 to ascertain the phase of the RF signal supplied to chuck electrode 418.

The outputs of sensors 414 and 416 are input into a mixer circuit 420, which may be implemented by any one of the conventional mixer circuit designs. The output of mixer circuit 420, representing the feedback signal that is proportional to the phase difference between the phases of the RF signals detected by sensors 414 and 416, is then input into a phase servo circuit 422. When the Phase/Bias select control signal 423 is set to phase control, phase servo circuit 422, which may be implemented by an error amplifier or any number of known phase servo circuit designs, compares the feedback signal from mixer circuit 420 with a phase control set point signal 424 to output a control signal 430 to the slave generator, e.g., RF generator 404 in FIG. 2A. Responsive to control signal 430, the slave generator then modifies its phase, thereby causing the phase difference between the phases of the RF signals detected by sensors 414 and 416 to substantially match the value specified by phase control set point signal 424.

In one embodiment, phase control set point value 424 may represent a predefined value to facilitate system matching, i.e., to ensure that the difference between the phases of the RF signals supplied to the upper electrode and lower electrode is substantially the same from machine to machine. The inventive technique of feedback control to ensure that the phase difference conforms to a predefined value is referred to herein as passive control of the phase difference. When the phase difference is passively controlled, it is possible to ensure that the phase difference between the phases of the RF signals will stay substantially constant across different systems irrespective of system parameters, e.g., the placement of the RF generators relative to the plasma processing chamber.

In another embodiment, phase control set point value 424 may represent a user-variable value for actively controlling the phase difference between the phases of the RF signals to achieve desired process results. The inventive technique of actively modifying the phase difference to achieve specific desired process results is referred to herein as active control of the phase difference. By way of example, a user may specify that the RF signal supplied to the upper electrode lead the RF signal supplied to the lower electrode by 180° to maximize aluminum-to-photoresist selectivity during an aluminum etch step (the effect of the phase difference on the aluminum-to-photoresist selectivity is illustrated in a subsequent FIG. 9 herein). As a further example, the user may specify that the RF power supplies deliver their power in phase to maximize the etch rate during an oxide etch step (FIG. 6A). Other examples are readily apparent to those skilled in the art upon reviewing the figures and the disclosure herein.

In another embodiment, either the chuck's RF peak-to-peak a.c. voltage or the wafer's d.c. voltage may be used as a feedback signal to facilitate control of either of those two values by changing the phase difference. With reference to FIG. 2A, an a.c./d.c. bias measurement circuit 440 represents, for ease of illustration, the circuit for measuring either the chuck's RF peak-to-peak a.c. voltage or the wafer's d.c. voltage (depending on the embodiment). By way of example, if the chuck employs mechanical clamping, a.c./d.c. bias measurement circuit 440 may represent a d.c. bias measurement circuit. On the other hand, if the chuck is an electrostatic chuck, a.c./d.c. bias measurement circuit 440 may represent either a d.c. bias measurement circuit or one that measures the chuck's RF peak-to-peak a.c. voltage.

The chuck's RF peak-to-peak a.c. voltage may be measured using a voltage probe or any other conventional technique. The wafer's d.c. voltage may be sensed by, for example, employing a probe inside chamber 406 to sense the state of the plasma within chamber 406, or by inferring it from the chuck's RF peak-to-peak a.c. voltage itself. For further information regarding a method of inferring the wafer's d.c. bias from the chuck's RF peak-to-peak a.c. voltage, reference may be made to the commonly-assigned, co-pending patent applications entitled "Dynamic Feedback Electrostatic Chuck," (Attorney's Docket No. P169/LAM1P006) and "Voltage Controller for Electrostatic Chuck of Vacuum Plasma Processors" by Neil Benjamin, Seyed Jafar Jafarian-Tehrani, and Max Artussi (Attorney's Docket No. 2328-016), both filed on even date, and incorporated herein by reference.

The signal output by a.c./d.c. bias measurement circuit 440 is then input into a peak bias control circuit 442. Peak bias control circuit 442 represents the circuit for comparing the signal output by a.c./d.c. bias measurement circuit 440 with a user-input bias set point signal 444 and for outputting an error signal 446. Responsive to this error signal, phase servo circuit 422 then modifies control signal 430, thereby modifying the phase difference between the RF signals supplied by the two RF generators and indirectly modifying either chuck's RF peak-to-peak a.c. voltage or the wafer's d.c. bias voltage (depending on the implementation of ac/dc bias measurement circuit 440) until it matches the bias set point signal 444.

It is contemplated that the signal output by a.c./d.c. bias measurement circuit 440 may be monitored by an appropriate logic circuit to allow the user to, for example, determine the phase difference that results in a specific value of chuck's RF peak-to-peak a.c. voltage (or wafer's d.c. bias voltage). By way of example, the phase of the slave generator may be modified while monitoring the value output by a.c./d.c. bias measurement circuit 440 to ascertain the phase difference value that results in, e.g., the highest or lowest chuck's RF peak-to-peak a.c. voltage (or wafer's d.c. bias voltage). Since these specific values of the chuck's RF peak-to-peak a.c. voltage (or the wafer's d.c. bias voltage) are directly related to specific process characteristics, the user may then employ the ascertained phase difference as an input into phase servo circuit 422 to ensure that the desired process results can be obtained more reliably and consistently.

It will be apparent to those skilled in the art that the inventive control circuit does not have to include all the components shown in FIG. 2A and may include essentially of sensors 414 and 416, mixer circuit 420, and phase servo circuit 422. With these circuit blocks, the detection of the phase difference between the RF signals supplied by the RF power supplies and the modification of that phase difference are facilitated. If it is desired to also modify the phase difference to achieve a specific RF peak-to-peak a.c. voltage set point or a specific wafer d.c. voltage set point, the control circuit may include a.c./d.c. bias measurement circuit 440 and peak bias control circuit 442 of FIG. 2A.

Figure 2B:
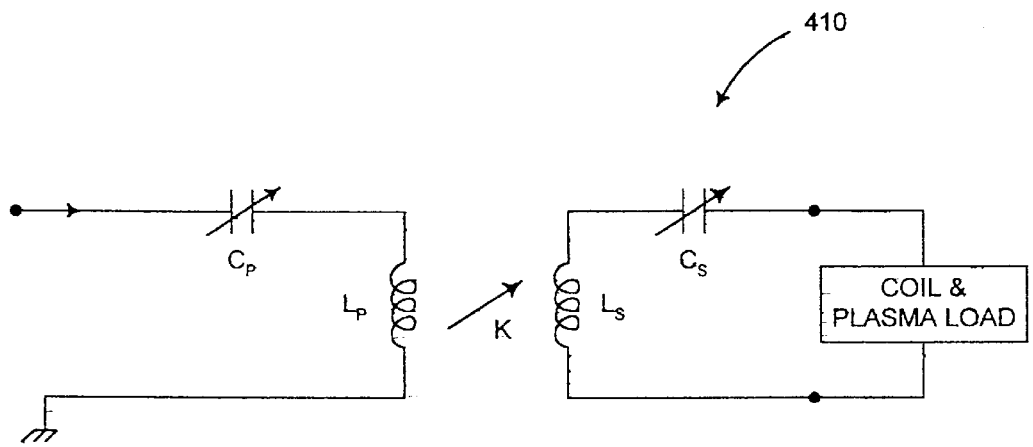
FIG. 2B shows an implementation of the upper TCP match circuit of the control circuit of FIG. 2A.

It should be noted that sensor 414 may, in one embodiment, be disposed between match circuit 410 and RF generator 404. Analogously, sensor 416 may be disposed between match circuit 408 and RF generator 402 in one embodiment. Match circuits 408 and 410 may be implemented by any number of conventional match circuits. FIG. 2B shows an implementation of upper TCP match circuit 410 that has been found to be suitable. In FIG. 2B, capacitor Cs resonates the inductance of the TCP coil. Capacitor CP transforms the load impedance to match the source impedance of the RF power source, which is typically about 50 Ω. Inductors LP and Ls are primary and secondary inductances of the match transformer. The values of these inductances LP and Ls depend on the coil size and the coupling factor between the coil and the plasma. One version of match circuit 410, known by its part number 853-031685-001, is available from the aforementioned Lam Research Corp.

Figure 2C:
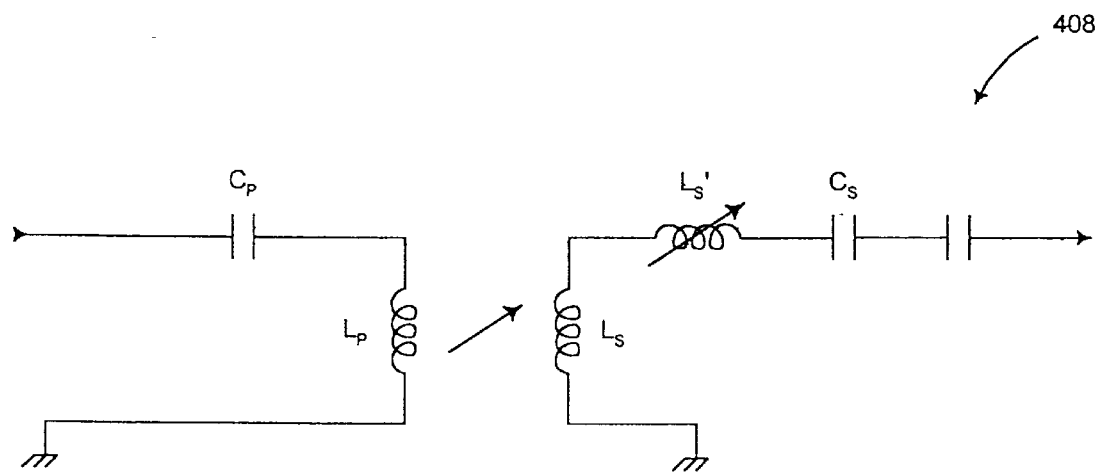
FIG. 2C illustrates an implementation of the lower TCP match circuit of the control circuit of FIG. 2A.

FIG. 2C illustrates an implementation of lower TCP match circuit 408. In FIG. 2C, variable inductor Ls' is employed to resonate the load. Variable coupling factor K transforms the load to the proper impedance to maximize power delivery by the RF generator. One version of match circuit 408, known by its part number 853-015130-002, is available from the aforementioned Lam Research Corp.

Figure 2D:
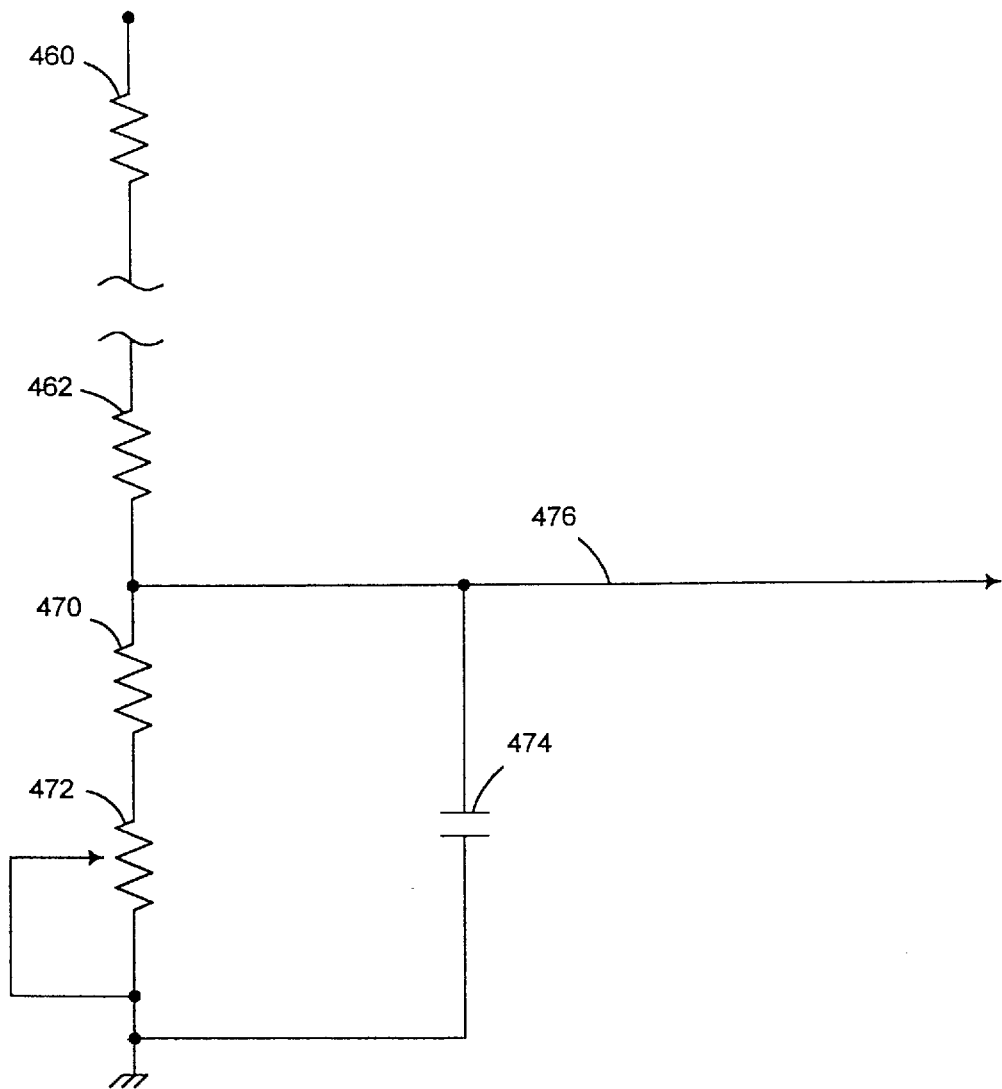
FIG. 2D illustrates an implementation of the d.c. bias measurement circuit of the control circuit of FIG. 2A.

FIG. 2D illustrates a d.c. bias measurement circuit that is suitable for implementing a.c./d.c. bias measurement circuit 440. In FIG. 2D, the chuck's RF signal is sensed through a plurality of resistors 460, which provides a high impedance to ground to limit amount of RF current drawn. In one embodiment, there are five resistors 460 in series to reduce the capacitive division effect of the d.c. bias measurement circuit. Resistors 470 and 472 form a resistor network for scaling down the signal received through the plurality of resistors 460. Capacitor 474 is coupled in parallel with resistors 470 and 472 to supply a d.c. signal on conductor 476, which is coupled to the peak bias control circuit, e.g., peak bias control circuit 442 of FIG. 2. One version of the d.c. bias measurement circuit, known by its part number 810-017029-001, is available from the aforementioned Lam Research Corp.

In accordance with one aspect of the present invention, the effects of the phase shift on process characteristics are investigated to determine whether changes to the phase shift impact certain critical process parameters such as the RF peak-to-peak voltage on the lower electrode, the wafer d.c. bias, etch rates, aluminum-to-photoresist selectivity, and others. As shown in the graphs of FIGS. 3 to 13 below, it is determined that changes in the phase shift between the RF signals supplied by the RF generators do indeed impact certain critical process parameters. These discoveries buttress the conclusion that the ability to achieve reliable, consistent process results can be enhanced when the phase shift is controlled either passively or actively.

In the disclosure that follows, it should be borne in mind that the disclosed invention may be practiced in any plasma etch systems to etch, among others, the metallization layer, the oxide layer, or the polysilicon layer. The invention may also be practiced, as can be appreciated by those skilled in the art, in plasma CVD systems to control film characteristics such as density and/or stress, or in any plasma processing systems, which may be employed for annodization, oxidation, or the like. To better illustrate the invention and to provide one specific example, however, details pertaining to specific systems and materials are disclosed. To achieve the results illustrated in subsequent FIGS. 3–13, two frequency-locked Advanced Energy 1,250 Watt 13.56 MHz RF generators are configured in a master-and-slave configuration to provide power to a TCP 9600™ etching system, which is available from Lam Research Corporation of Fremont, Calif. In this configuration, the lower (bias) generator is employed as the master to the upper (TCP) slave generator (although the invention applies equally well when the upper generator serves as the master).

To generate the requisite phase shift for the experiments pertaining to FIGS. 3–13, an ENI VL400 phase shift controller by ENI, which is a division of Astec America Inc. of Rochester, N.Y., was coupled to both generators to keep the lower (bias) generator fixed and to phase shift the upper (TCP) generator relative to the lower generator. To determine etch rates and selectivities, a patterned wafer from SEMATECH of Austin, Tex., was exposed to a partial etch. This SEMATECH wafer comprises the following layers: photoresist layer, TiN arc (anti-reflective) layer, metallization layer comprising aluminum-silicon-copper, barrier layer comprising titanium, and oxide layer. To determine the oxide etch rates, a wafer having thereon patterned thermal oxide is employed.

In the TCP 9600™ plasma processing system, the process settings for the experiments related to FIGS. 3–13 are approximately as follows:

TABLE 1

| Power to top electrode (watts) | 400 |
| Power to bottom electrode (watts) | 100 |
| Reactor chamber pressure (mTorr) | 5 |
| $Cl_2$ flow rate (sccm) | 62 |
| $BCl_3$ flow rate (sccm) | 18 |
| Wafer Temperature (°C.) | 50 |
| Helium cooling gas (Torr) | 12 |

To determine the impact of the phase shift between the RF signals supplied by the master-and-slave configured RF generators, four different phase shift settings were employed: −90° (i.e., the top generator lags the bottom generator by 90°), 0° (i.e., they are in phase), 90° (i.e., the top generator leads the bottom generator by 90°), and 180° (i.e., they are opposite in phase).

Figure 3:
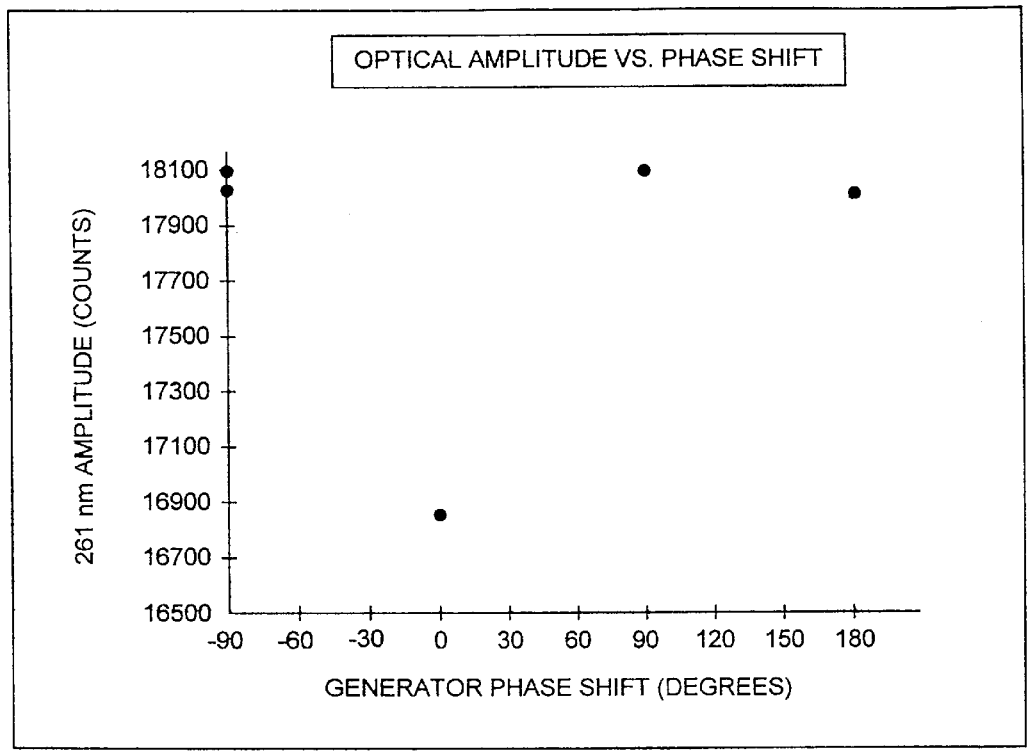
FIG. 3 is a graph illustrating, in accordance with one aspect of the present invention, the effect of the phase shift on the optical amplitude of the 261 nm plasma emission, which is employed to determine the endpoint for the aluminum etch.

FIG. 3 is a graph illustrating, in accordance with one aspect of the present invention, the effect of the phase shift on the optical amplitude of the 261 nm plasma emission, which is employed to determine the endpoint for the aluminum etch. Through appropriate optical filters, the mean value of the 261 nm signal when the generators are running in phase was observed to be low relative to the mean value of the same signal when the generators were running at −90°, 90°, and 180° out of phase respectively. The lower mean value of the optical signal suggests that relatively less intense plasma is present when the power is delivered by the two generators in phase.

Figure 4:
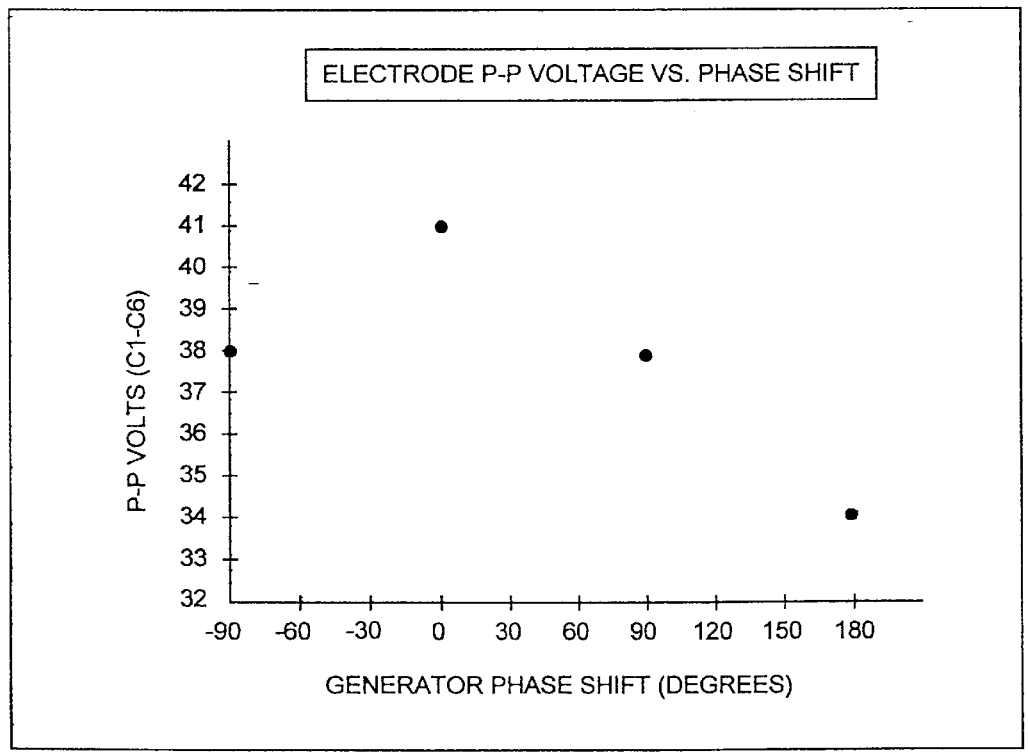
FIG. 4 is a graph illustrating, in accordance with one aspect of the present invention, the effect of the phase shift on the lower (bias) electrode RF peak-to-peak voltage.

FIG. 4 is a graph illustrating, in accordance with one aspect of the present invention, the effect of the phase shift on the lower (bias) electrode RF peak-to-peak voltage. FIG. 3 indicates that changes in phase shift indeed result in changes in the lower electrode RF peak-to-peak voltage in the range from about 34 to 41 volts, with the lower electrode RF peak-to-peak voltage attaining its maximum when the generators are in phase, as shown in FIG. 4. By controlling the phase shift, e.g., using the circuit of FIG. 2A or another suitable control circuit, the lower electrode RF peak-to-peak voltage may be controlled, leading to improved process results.

Figure 5:
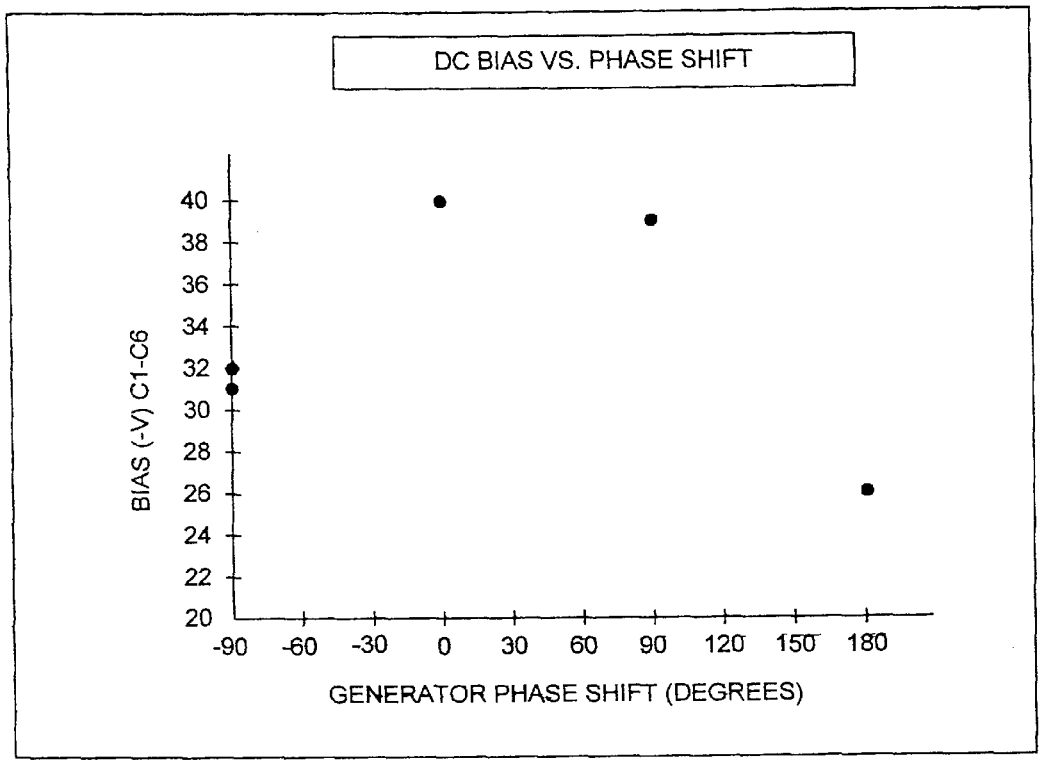
FIG. 5 is a graph illustrating, in accordance with one aspect of the present invention, the effect of the phase shift on the wafer d.c. bias voltage.

The d.c. bias of FIG. 5 tracked the lower electrode peak-to-peak voltage and varies from about—39 volts to—26 volts as the phase difference was shifted from 0° to 180°, as shown in FIG. 5. The changes in the d.c. bias voltage indicates that the plasma characteristics are significantly impacted by the phase shift. The d.c. bias voltage is directly linked to the process occurring on the wafer since when the d.c. bias is higher, the etching ions will likely impact the wafer with a higher energy to result in a higher etch rate and a more anisotropic etch. Since etching for semiconductor devices is a precise balancing of chemical and physical processes, and physical etching is tied directly to the difference between the plasma potential and the d.c. potential on the wafer, the bias needs to be under tight control, not only to ensure that repeatable process results can be achieved, but also to harness the phase shift to enhance process results, e.g., maximize or minimize the etch rates or the anisotropic etch quality. Again, the etch results suggest that desirable process characteristics may be achieved by controlling, either passively or actively, the phase difference between the RF signals supplied by the RF power supplies.

Further, since there is a correspondence between the wafer d.c. bias or the lower electrode RF peak-to-peak voltage and the phase shift, it is possible, as mentioned earlier in connection with FIG. 2A, to employ either the wafer d.c. bias or the lower electrode peak-to-peak voltage as a feedback signal to a phase control circuit in order to passively or actively control the phase difference, i.e., to either maintain a desired phase difference value across different plasma processing systems or to actively control the phase difference to enhance process results.

FIG. 6A is a graph illustrating, in accordance with one aspect of the present invention, the effect of the phase shift on the oxide etch rate. As shown in FIG. 6A, when the RF power supply to the top TCP coil lags the RF power supply to the bottom electrode by 90° (−90° in FIG. 6A), the oxide etch rate is approximately 1,600 angstroms per minute. In contrast, when these two RF power supplies are in phase, the oxide etch rate is up to about 1,750 angstroms per minute. The oxide etch rate when the top power supply leads the bottom power supply by 90° and 180° is significantly lower, at about 1,400 and 1,500 angstroms per minute respectively. As seen, significant changes in the oxide etch rates may be obtained by changing the phase shift. With reference to FIG. 6A, for example, an etch rate difference of up to about 300 angstroms per minute may be obtained when the phase shift changes from 0° to 90°.

Figure 6B:
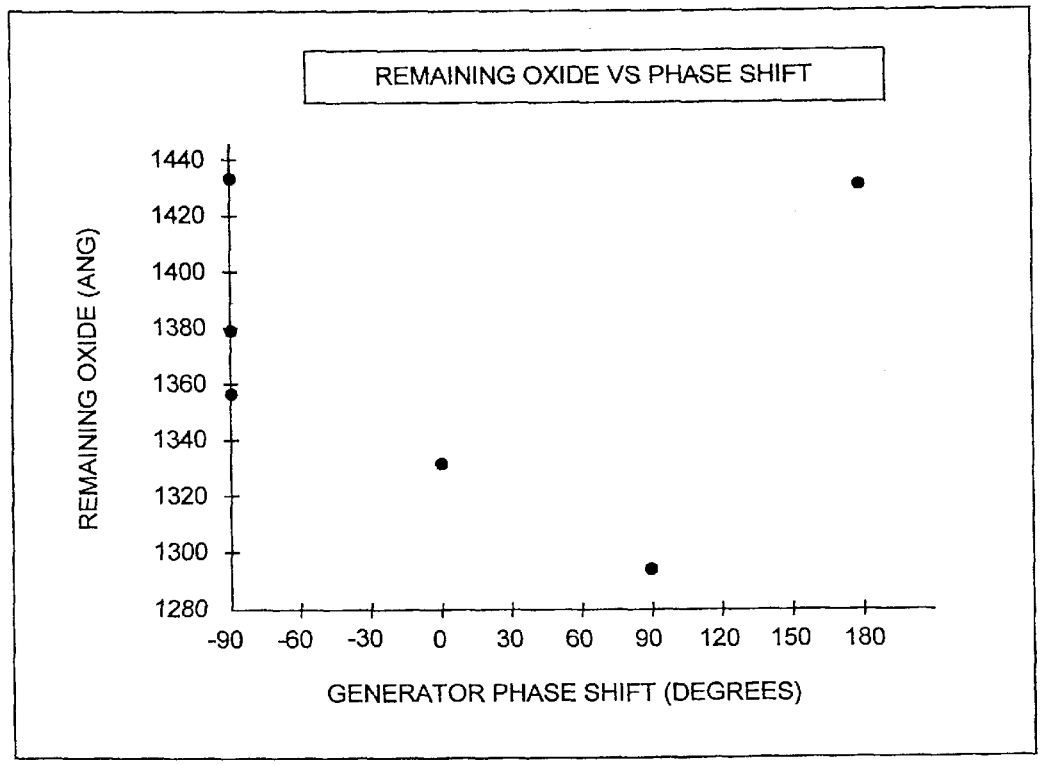
FIG. 6B is a graph illustrating, in accordance with one aspect of the present invention, the effect of the phase shift on the remaining oxide thickness.
Figure 6A:
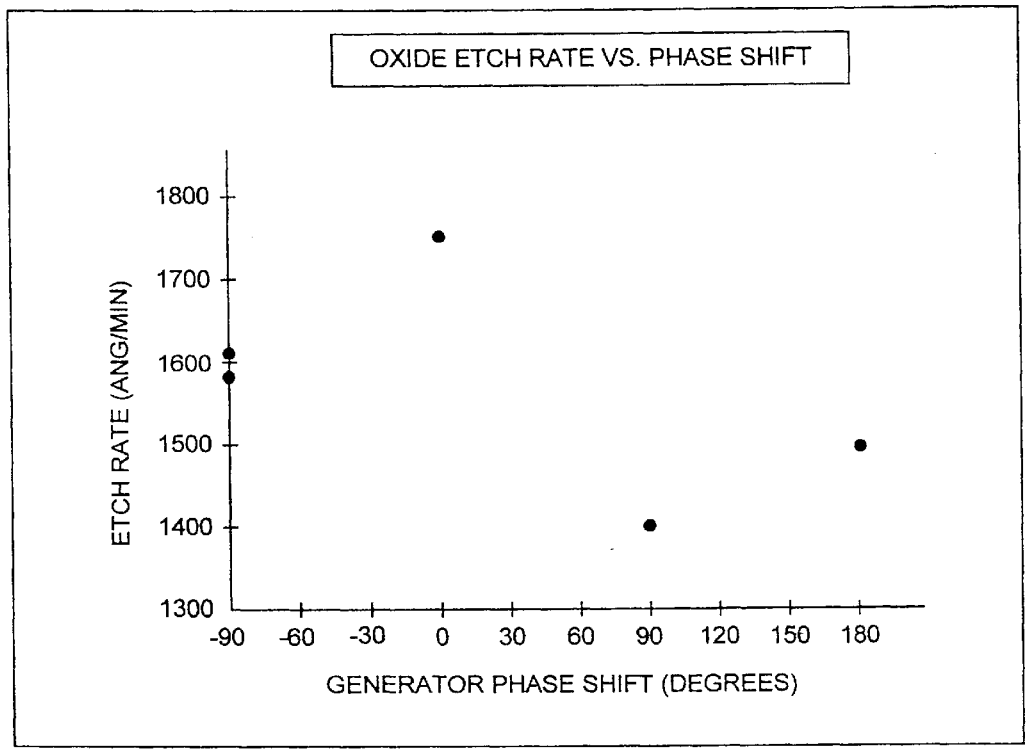
FIG. 6A is a graph illustrating, in accordance with one aspect of the present invention, the effect of the phase shift on the oxide etch rate.

FIG. 6B is a graph illustrating, in accordance with one aspect of the present invention, the effect of the phase shift on the remaining oxide thickness. The oxide thickness is at its lowest when the phase difference is about 90° and is high when the phase difference is either 0° or 180°. Consequently, changes to the phase difference do indeed impact the remaining oxide thickness, and further point to the advantages that may be achieved when the phase difference is controlled.

Figure 7:
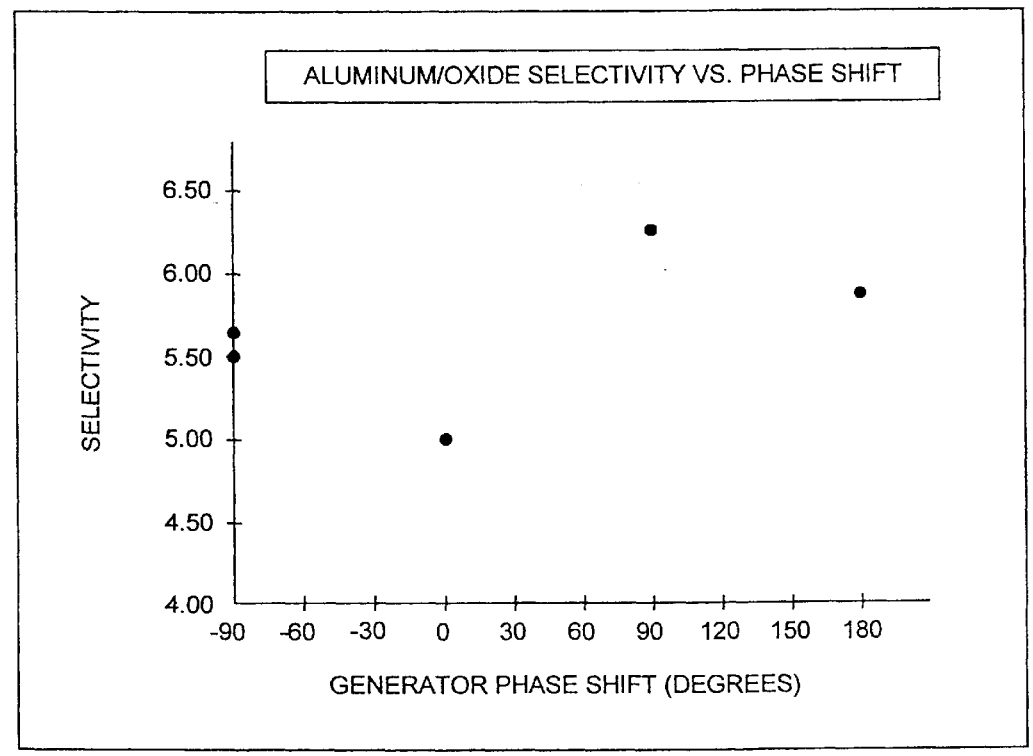
FIG. 7 is a graph illustrating, in accordance with one aspect of the present invention, the effect of the phase shift on the aluminum-to-oxide selectivity.

FIG. 7 is a graph illustrating, in accordance with one aspect of the present invention, the effect of the phase shift on the aluminum-to-oxide selectivity. As shown in FIG. 7, the selectivity varies significantly responsive to the phase shift, having values of about 5.6, 5.0, 6.5, and 6.0 for a phase shift value of about −90°, 0°, 90°, and 180°, respectively. Further, there appears to be a correlating trend between a high wafer d.c. bias (as seen in FIG. 5) and low selectivity. For example, when the power supplies are in phase, the wafer d.c. bias is at its highest (in FIG. 5) while the aluminum-to-oxide selectivity is at its lowest (in FIG. 7). One possible explanation is that when the power supplies are delivering power to the plasma in phase, a high d.c. bias may increase the energy of the impacting ions, thereby decreasing the aluminum-to-oxide selectivity.

Figure 8:
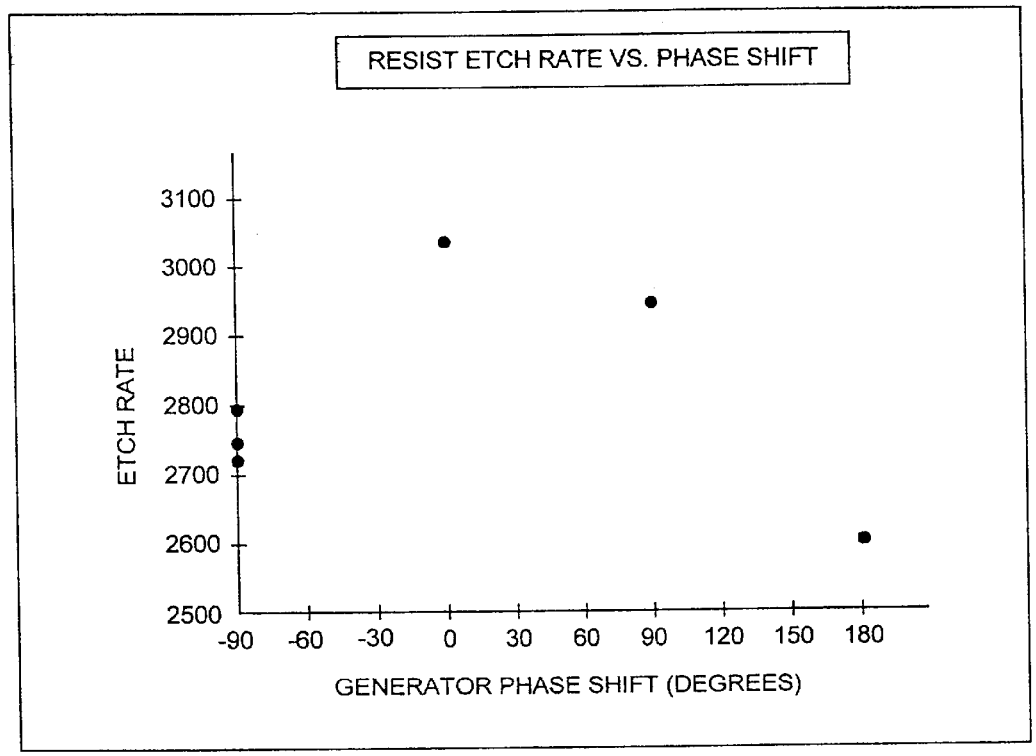
FIG. 8 is a graph illustrating, in accordance with one aspect of the present invention, the effect of the phase shift on the photoresist etch rate.

FIG. 8 is a graph illustrating, in accordance with one aspect of the present invention, the effect of the phase shift on the photoresist etch rate. Again, changes in the phase shift appear to significantly impact the etch rate of the photoresist with an etch rate of as high as over about 3,000 angstroms per minute when the power supplies are in phase, and about 2,600 angstroms per minute when the power supplies are about 180° out of phase.

Figure 9:
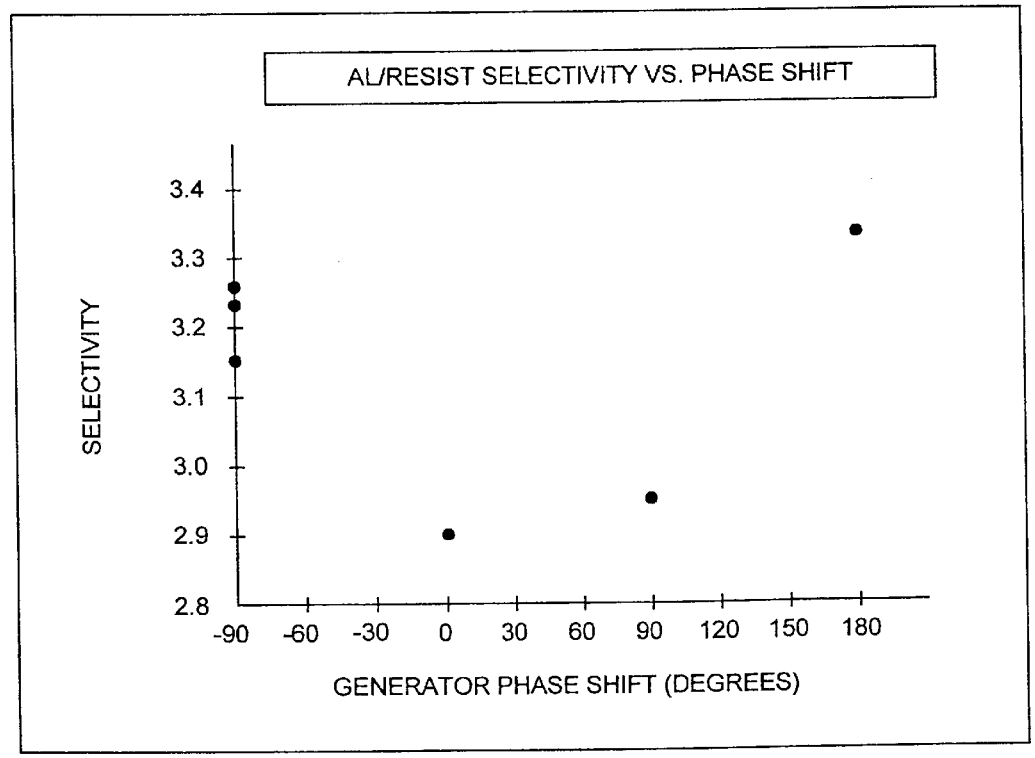
FIG. 9 is a graph illustrating, in accordance with one aspect of the present invention, the effect of the phase shift on the aluminum-to-photoresist selectivity.

In FIG. 9, the effect of the phase shift on the aluminum-to-photoresist selectivity is shown. FIG. 9 illustrates, in accordance with one aspect of the present invention, that changing the phase shift also significantly impacts the aluminum-to-photoresist selectivity. For example, the lowest aluminum-to-photoresist selectivity is obtained when the power supplies are delivering power to the plasma in phase (0° phase shift). The maximum selectivity, as illustrated in FIG. 9, is achieved when the power supplies are delivering power at about 180° out of phase. This has several important implications. As manufacturers move toward smaller devices, a high aluminum-to-photoresist selectivity is valuable. This is because as the lines become thinner, the photoresist layer must be thinner. A thinner photoresist layer requires a higher aluminum-to-photoresist selectivity so that the protective photoresist layer does not get inadvertently etched away, resulting in damage to the underlying features. FIG. 9 suggests that increased aluminum-to-photoresist selectivity can be achieved by changing the phase shift between the RF power supplies.

Further, as the trend of FIGS. 6A, 7, and 8 suggests, the highest etch rate and lowest selectivities are obtained when the power supplies are in phase. It appears that the aluminum-to-photoresist selectivity can be improved when the power supplies are delivering power to the plasma out of phase. For example, the highest aluminum-to-oxide selectivity occurs when the power supplies are about 90° out of phase (FIG. 7), and the highest aluminum-to-photoresist selectivity occurs when the power supplies are about 180° out of phase (FIG. 9).

FIGS. 8 and 9 also suggest that the slowest photoresist etch rate and the highest aluminum-to-photoresist selectivity are obtained when the power supplies are delivering power to the plasma at about 180° out of phase. At about 180°, it can be expected that more of the photoresist will remain, i.e., less of the photoresist layer will get etched away, resulting in better protection of the underlying features. The ability to adjust the hardware to improve the ability of a given photoresist layer to protect the underlying features is particularly valuable as devices are scaled smaller and smaller.

Figure 10:
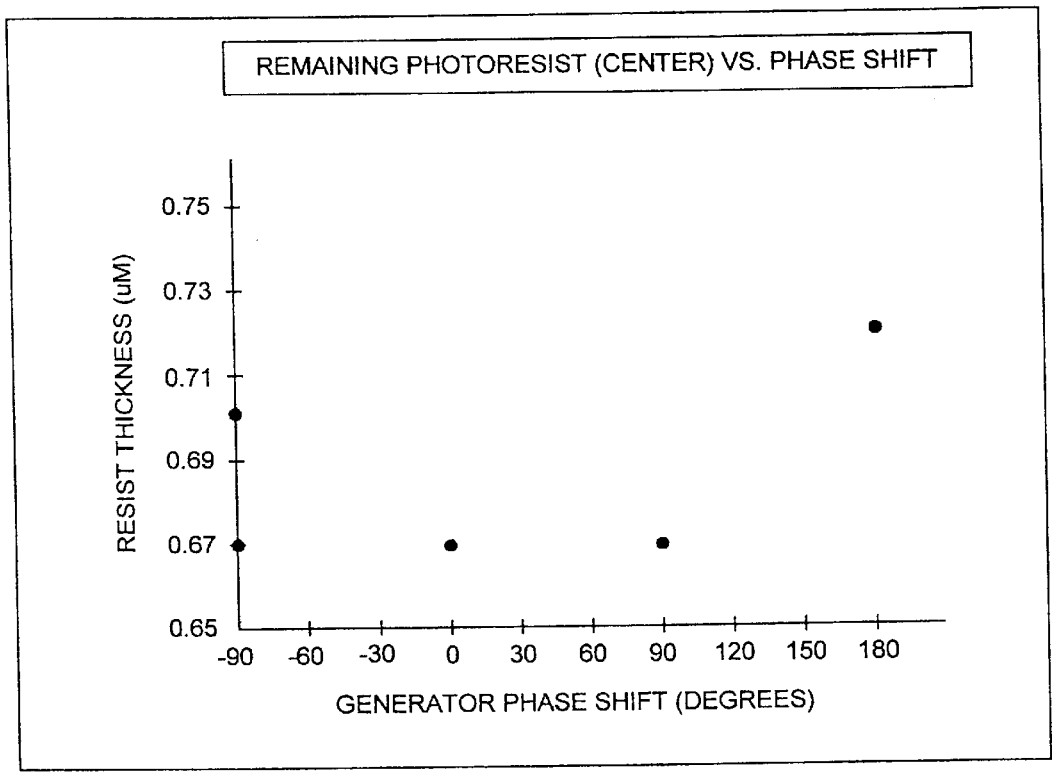
FIGS. 10 and 11 are graphs illustrating, in accordance with one aspect of the present invention, the effect of the phase shift on the remaining photoresist thickness at the center of the wafer (FIG. 10), and at the edge of the wafer (FIG. 11).
Figure 11:
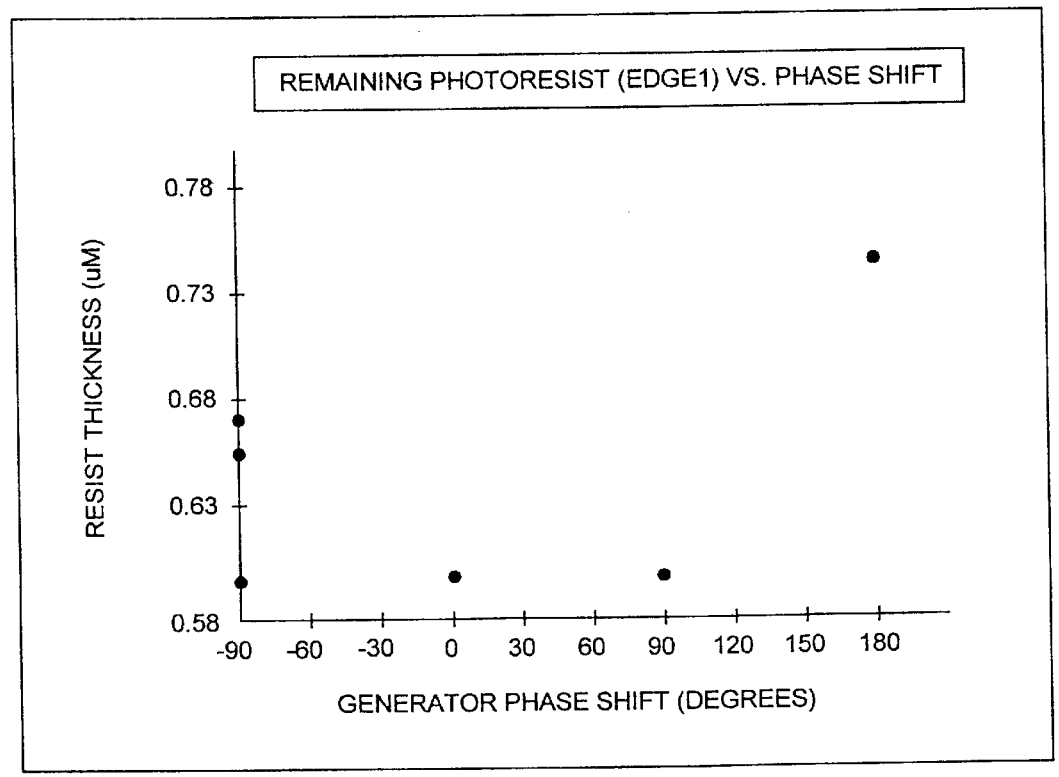

In FIGS. 10 and 11, remaining photoresist on 0.8 micron feature is measured, after etching with a recipe commonly used to etch through the aluminum layer in semiconductor manufacturing, at the center of the wafer (FIG. 10), and at the edge of the wafer (FIG. 11). As shown in FIGS. 10 and 11, maximum remaining photoresist thickness measurements occur when the power supplies deliver their power at about 180° phase shift. Note that the remaining photoresist thickness measurements are maximized and minimized at the same phase shifts, i.e., at 180° phase shift and about 90° phase shift respectively, in both FIG. 10 and FIG. 11. Consequently, it appears that the changes in the phase shift result in bulk plasma effects, i.e., not localized either at the wafer edge or the wafer center. It is therefore expected, in accordance with one aspect of the present invention, that changes to the phase difference affect the protective quality of the photoresist layer across the entire wafer.

Figure 12:
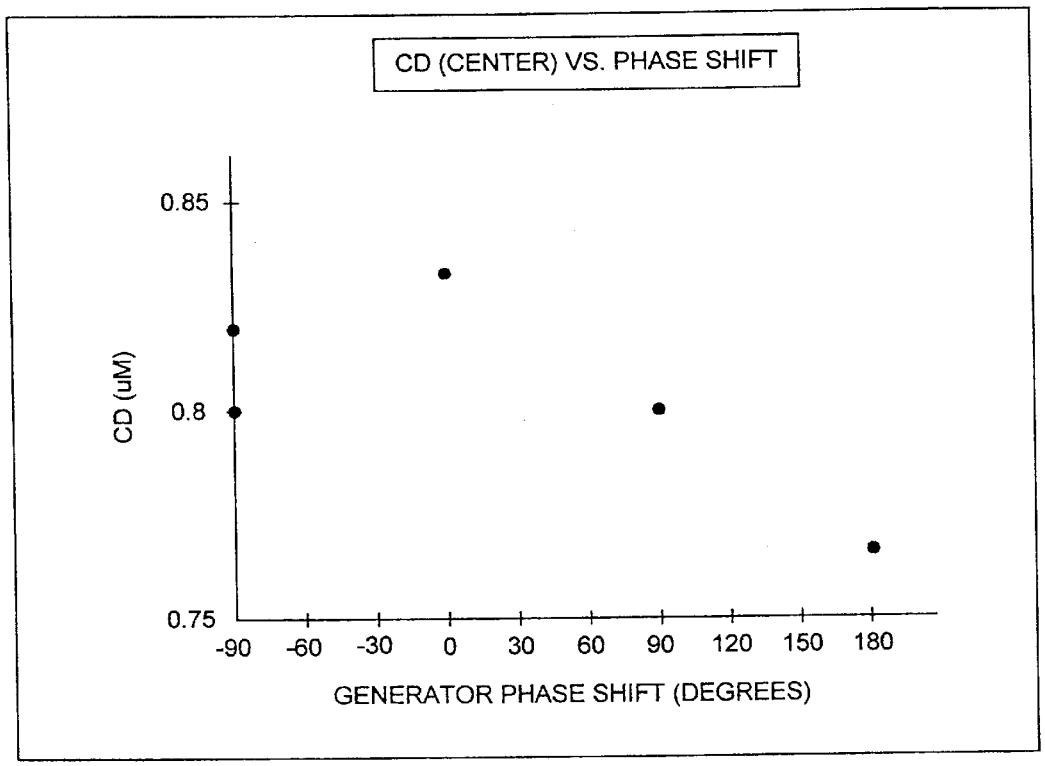
FIGS. 12 and 13 are graphs illustrating, in accordance with one aspect of the present invention, the effect of the phase shift on the critical dimension (CD) at the center of the wafer and the edge of the wafer respectively.
Figure 13:
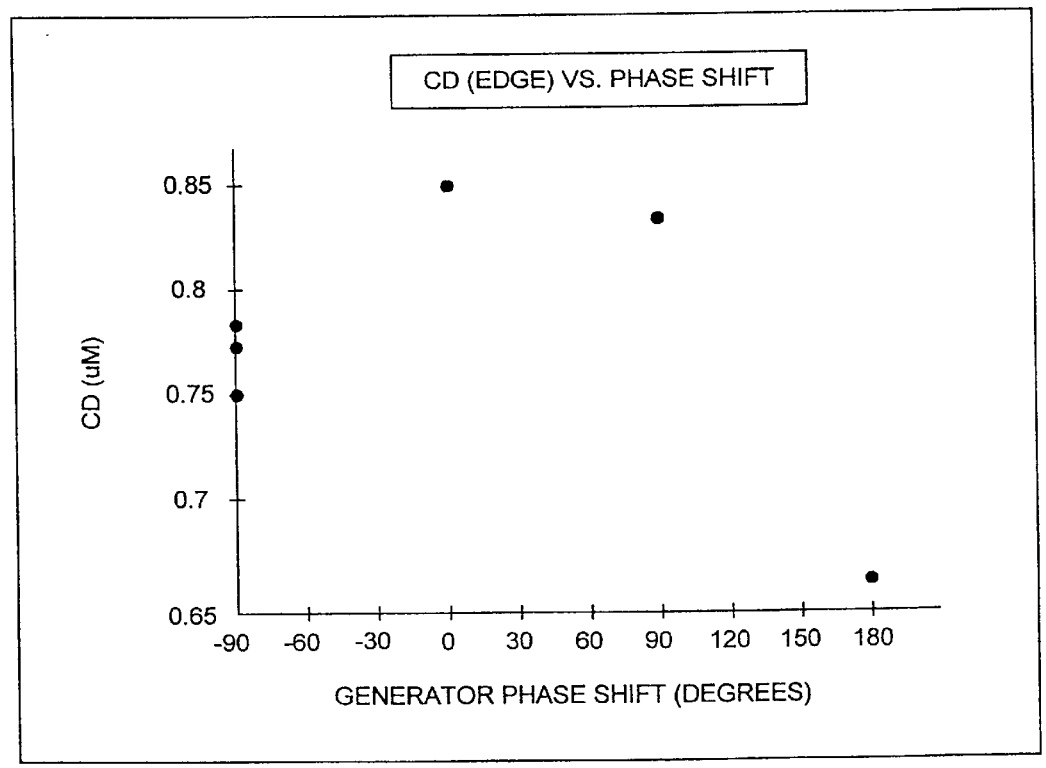

FIGS. 12 and 13 illustrate the effect of the phase shift on the critical dimension (CD) at the center of the wafer and the edge of the wafer respectively. The critical dimension (CD) represents the post-etch measurement of the line width. Maximum critical dimension measurements were obtained when the generators were in the high bias, in-phase condition, when photoresist erosion was at a maximum. A high amount of photoresist erosion passivates the sidewall to a greater degree to protect the aluminum against erosion, resulting in more protection for the lines and a greater CD measurement. Minimum critical dimension measurements occur at both the wafer center and the wafer edge when the generators were running at a phase shift of about 180° and, as shown in FIG. 8, the photoresist etch rate is at its minimum. Since there is less photoresist erosion, less passivation of the sidewall occurs. As shown in FIGS. 12 and 13, changes in the phase shift between the generators result in changes in the critical dimension. These figures suggest that undercutting of the aluminum sidewall can be minimized, in accordance with one aspect of the present invention, simply by changing the phase shift between the generators.

Figure 14:
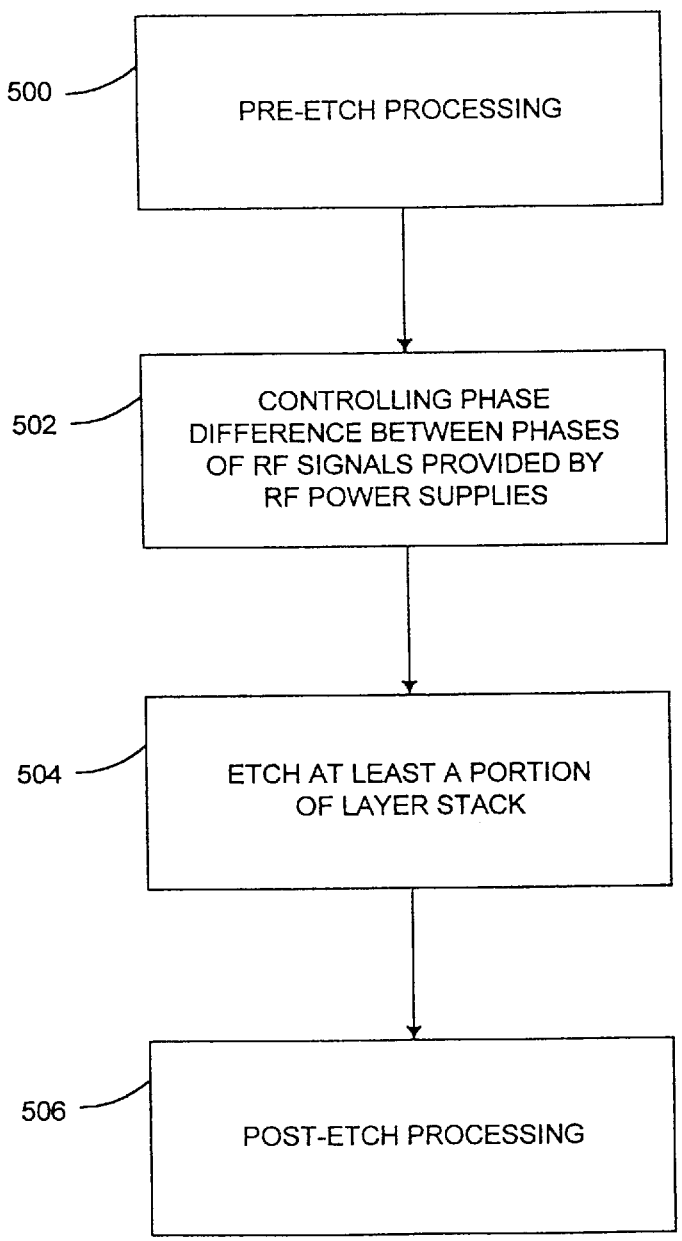
FIG. 14 shows, in accordance with one aspect of the present invention, the steps involved in the inventive etch process in which the phase difference between the RF power supplies are controlled, either actively or passively, to achieve the desired process results.

FIG. 14 shows, in accordance with one aspect of the present invention, the steps involved in the inventive etch process in which the phase difference between the RF signals supplied by the RF power supplies are controlled, either actively or passively, to achieve the desired process results. In step 500, the wafer is prepared for etching in a conventional pre-etch step. The pre-etch stepS may include, for example, conventional photolithography steps, clamping the wafer on the chuck, stabilizing the pressure within the plasma processing chamber, and introducing helium cooling gas to the wafer backside to facilitate heat transfer between the wafer and the chuck, among others.

In step 502, the phase difference between the RF signals provided by the RF power supplies is controlled, e.g., using the circuit of FIG. 2A. As mentioned earlier, the control may be passive (i.e., to ensure that the phase difference does not vary from a predefined value), or active (i.e., actively control the phase difference to match a user-specified phase difference value). In step 504, at least a portion of one layer of the wafer layer stack is etched while controlling the phase difference. Note that although this step 504 occurs after step 502, control of the phase difference preferably continues during etching. Further, step 504 may be initiated either before, contemporaneous with, or after the initiation of step 502.

Figure 1:
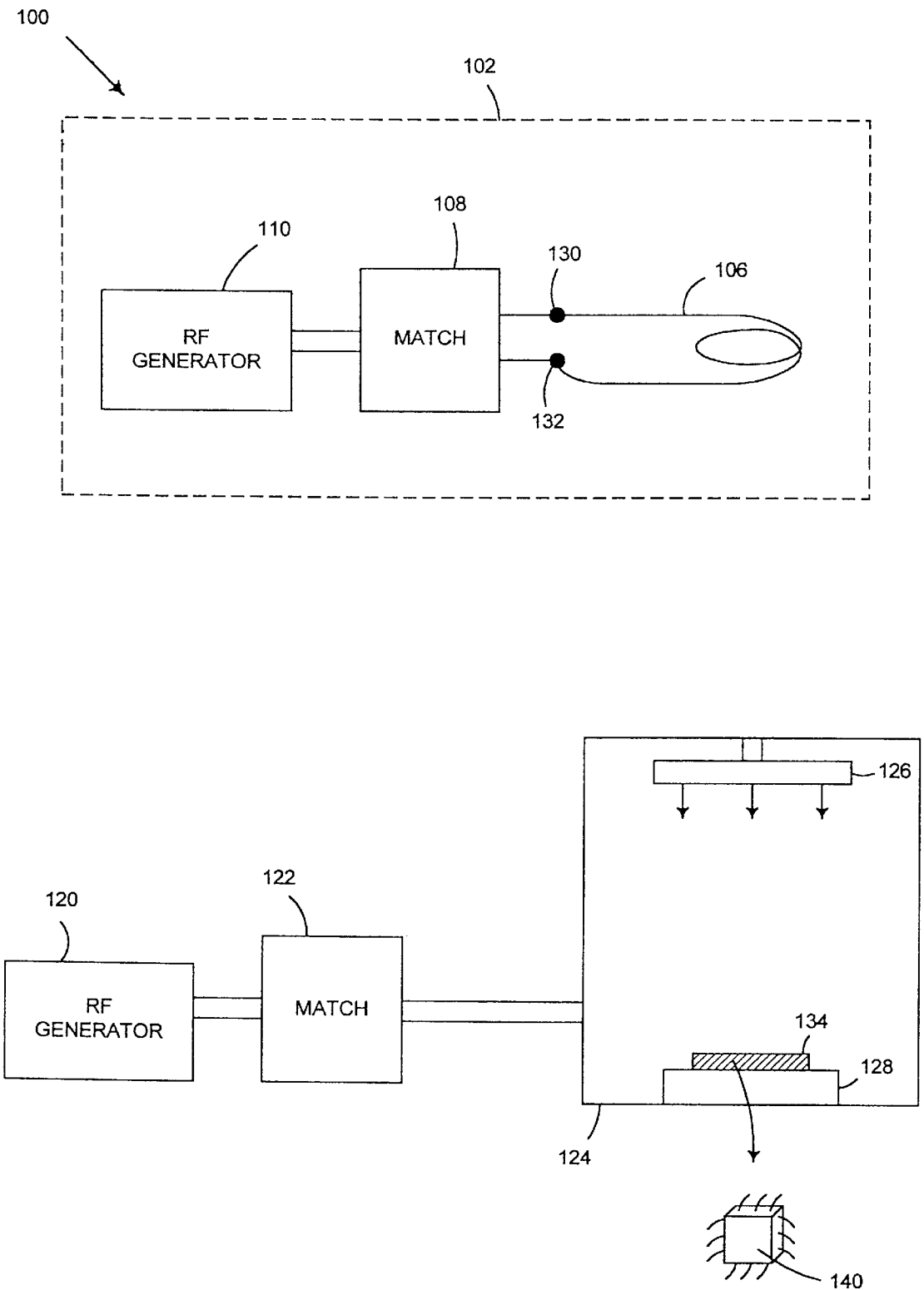
FIG. 1 shows a typical plasma generating system.

In step 506, the wafer may undergo additional processing steps to fabricate the desired components as well as post-etch processing steps that are conventional in nature. Thereafter, the finished wafer may be cut into dies, which may then be made into IC chips. The resulting IC chip, e.g., IC chips 140 of FIG. 1, may then be incorporated in an electronic device, e.g., any of the of well known commercial or consumer electronic devices, including digital computers.

What is claimed is:

1. A plasma processing system for generating plasma for use in semiconductor fabrication, said plasma processing chamber having a first radio frequency (RF) power source for outputting a first RF signal to a first electrode and a second RF power source for outputting a second RF signal to a second electrode, said second RF power source being coupled to said first RF power source as a slave RF power source in a master-and-slave configuration, said plasma processing system comprising a control circuit, including:

a first sensor circuit coupled to said first electrode for detecting a phase of said first RF signal;

a second sensor circuit coupled to said second electrode for detecting a phase of said second RF signal;

a mixer circuit coupled to said first sensor circuit and said second sensor circuit for detecting a phase difference between said first RF signal and said second RF signal and for outputting a first signal representing said phase difference;

a phase servo circuit coupled to said second RF power source and said mixer circuit, said phase servo circuit outputting, responsive to said first signal and a phase control set point signal, a control signal to said second RF power source for modifying a phase of said second RF signal, thereby causing said phase difference to approximate a phase difference value represented by said phase control set point signal.

2. The plasma processing system of claim 1 wherein said phase control set point signal is a user-variable signal to actively control said phase difference.

3. The plasma processing system of claim 1 wherein said first electrode represents a lower bias electrode of said plasma processing system.

4. The plasma processing system of claim 1 wherein said first electrode represents an upper electrode of said plasma processing system.

5. The plasma processing system of claim 4 wherein said upper electrode is a coil.

6. The plasma processing system of claim 1 wherein said control circuit further comprising:

a bias measurement circuit for measuring a chuck RF peak-to-peak a.c. voltage;

a peak bias control circuit coupled to said bias measurement circuit and a bias set point signal, said peak bias control circuit outputting an error signal to said phase servo circuit for causing said second RF power source, responsive to said control signal from said phase servo circuit, to modify said phase of said second RF signal, thereby causing said chuck RF peak-to-peak a.c., voltage to approximate an RF peak-to-peak voltage represented by said bias set point signal.

7. The plasma processing system of claim 1 wherein said control circuit further comprising:

a bias measurement circuit for measuring a d.c. voltage on a wafer being processed in said plasma processing system;

a peak bias control circuit coupled to said bias measurement circuit and a bias set point signal, said peak bias control circuit outputting an error signal to said phase servo circuit for causing said second RF power source, responsive to said control signal from said phase servo circuit, to modify said phase of said second RF signal, thereby causing said d.c. voltage on said wafer to approximate a user input d.c. voltage represented by said bias set point signal.

8. A control circuit for modifying a phase difference between a first radio frequency (RF) signal and a second RF signal, said first RF signal being supplied by a first RF power source to a first electrode and said second RF signal being supplied by a second RF power source to a second electrode of a plasma processing system, said second RF power source being coupled to said first RF power source as a slave RF power source in a master-and-slave configuration, said control circuit comprising:

a first sensor circuit for coupling to said first electrode to facilitate detection of a phase of said first RF signal;

a second sensor circuit for coupling to said second electrode to facilitate detection of a phase of said second RF signal;

a mixer circuit coupled to said first sensor circuit and said second sensor circuit for detecting a phase difference between said first RF signal and said second RF signal and for outputting a first signal representing said phase difference;

a phase servo circuit for coupling to said second RF power source and said mixer circuit, said phase servo circuit outputting, responsive to said first signal and a phase control set point signal, a control signal to said second RF power source for modifying a phase of said second RF signal, thereby causing said phase difference to approximate a phase difference value represented by said phase control set point signal.

9. The control circuit of claim 8 wherein said phase control set point signal is a user-variable signal to actively control said phase difference.

10. The control circuit of claim 8 wherein said first electrode represents a lower bias electrode of said plasma processing system.

11. The control circuit of claim 8 wherein said first electrode represents an upper electrode of said plasma processing system.

12. The control circuit of claim 11 wherein said upper electrode is a coil.

13. The control circuit of claim 8 further comprising:

a bias measurement circuit for measuring a chuck RF peak-to-peak a.c. voltage;

a peak bias control circuit coupled to said bias measurement circuit and a bias set point signal, said peak bias control circuit outputting an error signal to said phase servo circuit for causing said second RF power source, responsive to said control signal from said phase servo circuit, to modify said phase of said second RF signal, thereby causing said chuck RF peak-to-peak a.c., voltage to approximate an RF peak-to-peak voltage represented by said bias set point signal.

14. The control circuit of claim 8 further comprising:

a bias measurement circuit for measuring a d.c. voltage on a wafer being processed in said plasma processing system;

a peak bias control circuit coupled to said bias measurement circuit and a bias set point signal, said peak bias control circuit outputting an error signal to said phase servo circuit for causing said second RF power source, responsive to said control signal from said phase servo circuit, to modify said phase of said second RF signal, thereby causing said d.c. voltage on said wafer to approximate a user input d.c. voltage represented by said bias set point signal.

15. In a plasma processing system, a method for modifying a phase difference between a first radio frequency (RF) signal and a second RF signal, said first RF signal being supplied by a first RF power source to a first electrode and said second RF signal being supplied by a second RF power source to a second electrode of a plasma processing system, said second RF power source being coupled to said first RF power source as a slave RF power source in a master-and-slave configuration, said method comprising:

ascertaining a phase difference between a phase of said first RF signal and a phase of said second RF signal;

comparing said phase difference with a phase control set point signal to output a control signal to said second RF power source, whereby said second RF power source, responsive to said control signal, modifies said phase of said second RF signal to cause said phase difference to approximate a phase difference value represented by said phase control set point signal.

16. The method of claim 15 wherein said second electrode represents a lower bias electrode of said plasma processing system.

* * * * *